(12) United States Patent
Kwon et al.

(10) Patent No.: US 11,127,862 B2
(45) Date of Patent: *Sep. 21, 2021

(54) THREE-DIMENSIONAL NON-VOLATILE MEMORY DEVICE AND METHOD OF MANUFACTURING THE SAME

(71) Applicant: SK hynix Inc., Gyeonggi-do (KR)

(72) Inventors: Eun Mee Kwon, Gyeonggi-do (KR); Da Som Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/561,604

(22) Filed: Sep. 5, 2019

(65) Prior Publication Data

US 2020/0144426 A1 May 7, 2020

(30) Foreign Application Priority Data

Nov. 5, 2018 (KR) .......................... 10-2018-0134487

(51) Int. Cl.
*H01L 29/792* (2006.01)
*H01L 29/66* (2006.01)
*H01L 27/11582* (2017.01)

(52) U.S. Cl.
CPC .... *H01L 29/7926* (2013.01); *H01L 27/11582* (2013.01); *H01L 29/66833* (2013.01)

(58) Field of Classification Search
None
See application file for complete search history.

(56) References Cited

U.S. PATENT DOCUMENTS

| 8,765,538 | B2 | 7/2014 | Kim et al. |
| 9,373,635 | B2 | 6/2016 | Jung et al. |
| 9,543,401 | B2 | 1/2017 | Kim et al. |
| 2012/0139027 | A1 | 6/2012 | Son et al. |
| 2014/0264525 | A1 | 9/2014 | Takahashi et al. |
| 2015/0060977 | A1 | 3/2015 | Lee et al. |
| 2016/0149049 | A1* | 5/2016 | Sharangpani ..... H01L 27/11573 257/314 |
| 2017/0365613 | A1 | 12/2017 | Gunji-Yoneoka et al. |

(Continued)

FOREIGN PATENT DOCUMENTS

| KR | 1020130023767 | 3/2013 |
| KR | 10-2016-0137091 A | 11/2016 |

OTHER PUBLICATIONS

Weigold, J. W. et al., Etching and boron diffusion of high aspect ratio Si trenches for released resonators, J. Vac. Sci. Technol. B, Mar./Apr. 1997, pp. 267-272, vol. 15, No. 2, American Vacuum Society.

(Continued)

*Primary Examiner* — Alexander G Ghyka
(74) *Attorney, Agent, or Firm* — IP & T Group LLP

(57) ABSTRACT

In a method of manufacturing a non-volatile memory device, a stack structure may be formed on a semiconductor substrate. The stack structure may be etched to form a contact hole through the stack structure. The contact hole may be filled with a gap-filling insulation layer. Ions may be implanted into a target position of the gap-filling insulation layer. The gap-filling insulation layer may be selectively removed to define a preliminary junction region. A junction region may be formed in the preliminary junction region.

25 Claims, 19 Drawing Sheets

(56) References Cited

U.S. PATENT DOCUMENTS

| | | | | |
|---|---|---|---|---|
| 2018/0366486 A1* | 12/2018 | Hada | ................. | H01L 27/11556 |
| 2019/0305095 A1* | 10/2019 | Choi | ................. | H01L 27/11565 |
| 2020/0194441 A1* | 6/2020 | Kwon | ............... | H01L 27/11509 |
| 2020/0295025 A1* | 9/2020 | Lu | ........................... | H01L 25/50 |
| 2020/0342939 A1* | 10/2020 | Widjaja | ............ | H01L 29/66825 |

OTHER PUBLICATIONS

Notice of Allowance issued by the USPTO for U.S. Appl. No. 16/562,100 dated Apr. 30, 2021.

* cited by examiner

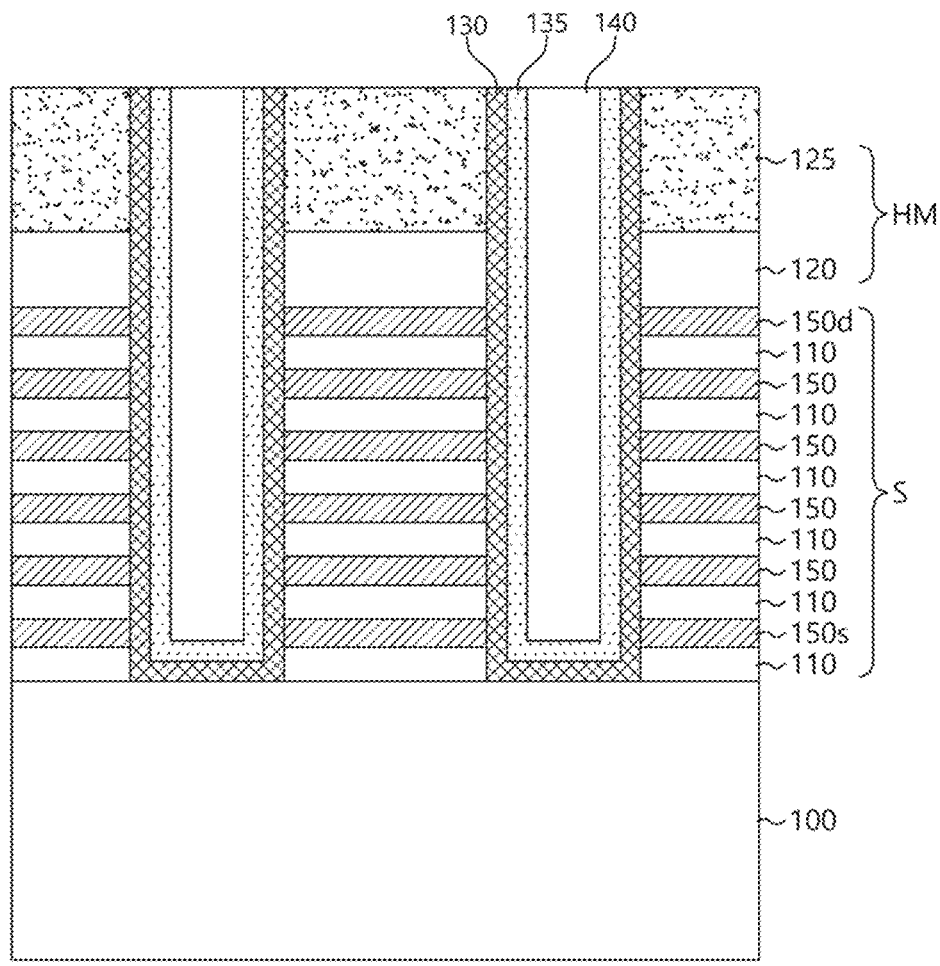

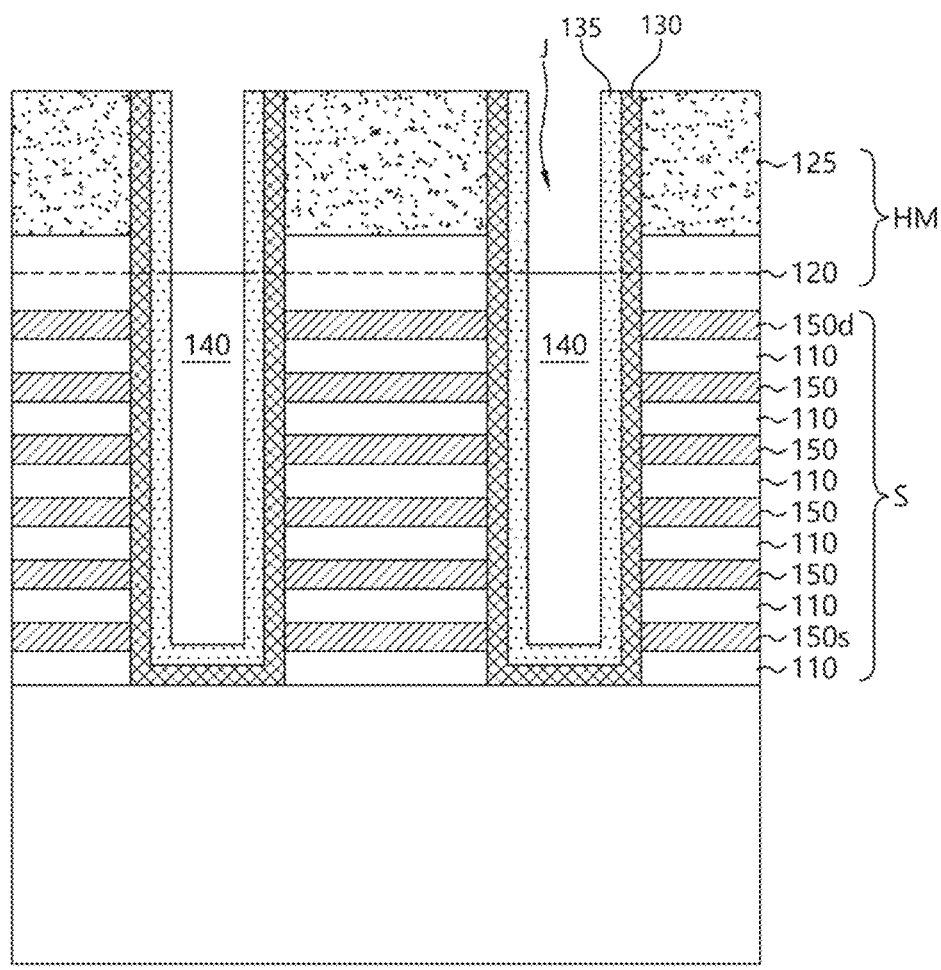

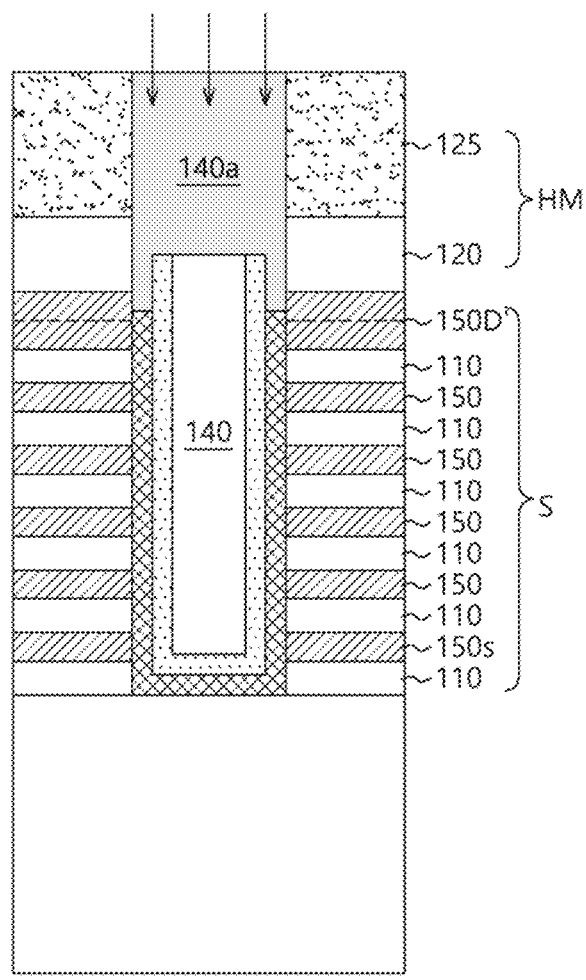

THREE-DIMENSIONAL NON-VOLATILE MEMORY DEVICE AND METHOD OF MANUFACTURING THE SAME

CROSS-REFERENCES TO RELATED APPLICATION

The present application claims priority under 35 U.S.C. § 119(a) to Korean application number 10-2018-0134487, filed on Nov. 5, 2018, in the Korean Intellectual Property Office, which is incorporated herein by reference in its entirety.

BACKGROUND

1. Technical Field

Various embodiments of the present invention generally relate to a non-volatile memory device and a method of manufacturing the same. More particularly, various embodiments relate to a three-dimensional, non-volatile memory device having improved performance characteristics and a method of manufacturing the non-volatile memory device.

2. Related Art

Generally, there is an ever-increasing consumer demand for smaller size, and/or higher data processing capacity electronic devices. This, in turn, requires increasing the integration degree of the semiconductor memory devices that are employed in the electronic devices. For increasing the integration degree of the semiconductor memory devices, three-dimensional non-volatile memory devices having a vertical transistor structure in place of a planar transistor structure have been developed. Three-dimensional non-volatile memory devices are rather new technology and significant research and development continues to poor into these devices for improving their capacity, structural integrity, and other performance characteristics.

SUMMARY

Various embodiments of the present invention in its broadest aspects relate to an improved three-dimensional (3D) non-volatile memory device and a method for making the same. The inventive 3D non-volatile memory device exhibits improved performance characteristics.

According to an embodiment of the present invention, a method of manufacturing a non-volatile memory device is provided, the method comprising forming a stack structure on a semiconductor substrate. The stack structure may be etched to form a contact hole through the stack structure. The contact hole may be filled with a gap-filling insulation layer. Ions may be implanted into a target position of the gap-filling insulation layer. The gap-filling insulation layer may be selectively removed to define a preliminary junction region. A junction region may be formed in the preliminary junction region.

According to another embodiment of the present invention, a method of manufacturing of a non-volatile memory device comprises forming a first layer and a second layer alternately on a semiconductor substrate to form a stack structure. The stack structure may be etched to form a contact hole through the stack structure. A memory layer and a channel layer may be sequentially formed on a surface of the contact hole. The contact hole may be filled with a gap-filling insulation layer. The second layer may be removed. A conductive layer may be formed in a space formed by removing the second layer to form gates. The gap-filling insulating layer may be partially removed. A junction region may be formed in a space formed by removing the gap-filling insulation layer. An uppermost gate among the gates may have a thickness greater than that of the rest of the gates.

According to yet another embodiment of the present invention, a non-volatile memory device is provided, the non-volatile memory device including a semiconductor substrate, a stack structure and a channel pillar. The stack structure may be arranged on the semiconductor substrate. The stack structure may include an insulation layer and a gate alternately stacked. The channel pillar may be formed through the stack structure. The channel pillar may include a memory layer, a channel layer, a gap-filling insulation layer and a junction region. The memory layer may be formed on an inner surface of a contact hole formed through the stack structure. The channel layer may be formed on a surface of the memory layer. The gap-filling insulating layer may be formed in the contact hole. The junction region may be formed in the contact hole over the gap-filling insulating layer. An uppermost gate among the gates may have a thickness greater than that of the rest of the gates. The junction region may have a bottom surface positioned at an upper edge of the uppermost gate.

BRIEF DESCRIPTION OF THE DRAWINGS

The above and other aspects, features and advantages of the various embodiments of the present invention will be more clearly understood from the following detailed description taken in conjunction with the accompanying drawings, in which:

FIGS. 4A to 4G are cross-sectional views illustrating a method of manufacturing a 3D non-volatile memory device in accordance with an embodiment of the present invention;

FIG. 7 is a cross-sectional view illustrating a method of manufacturing a 3D non-volatile memory device in accordance with an embodiment of the present invention.

DETAILED DESCRIPTION

Various embodiments of the present invention will be described in greater detail with reference to the accompanying drawings. The drawings are simplified schematic illustrations of various embodiments and intermediate structures. As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

It is noted that reference to "an embodiment," "another embodiment" or the like does not necessarily mean only one embodiment, and different references to any such phrase are not necessarily to the same embodiment(s).

It is further noted that the present invention is described herein with reference to cross-section and/or plan illustrations of idealized embodiments of the present invention. However, embodiments of the present invention should not be construed as limiting the inventive concept. Hence, although a few embodiments of the present invention are shown and described, it should be appreciated by those of ordinary skill in the art that changes may be made in these embodiments without departing from the principles and spirit of the present invention.

As used herein, singular forms may include the plural forms as well and vice versa, unless the context clearly indicates otherwise. The articles 'a' and 'an' as used in this application and the appended claims should generally be construed to mean 'one or more' unless specified otherwise or clear from context to be directed to a singular form.

It is also noted that many other embodiments may be envisioned by those with ordinary skill in the art wherein a feature described in conjunction with one of the described embodiments may be employed with one or more features of another described embodiment without departing from the spirit and scope of the present invention.

It is also noted that in describing the embodiments of the invention well known details are omitted in order to avoid obscuring the description of the essence of the invention.

Figure 1:
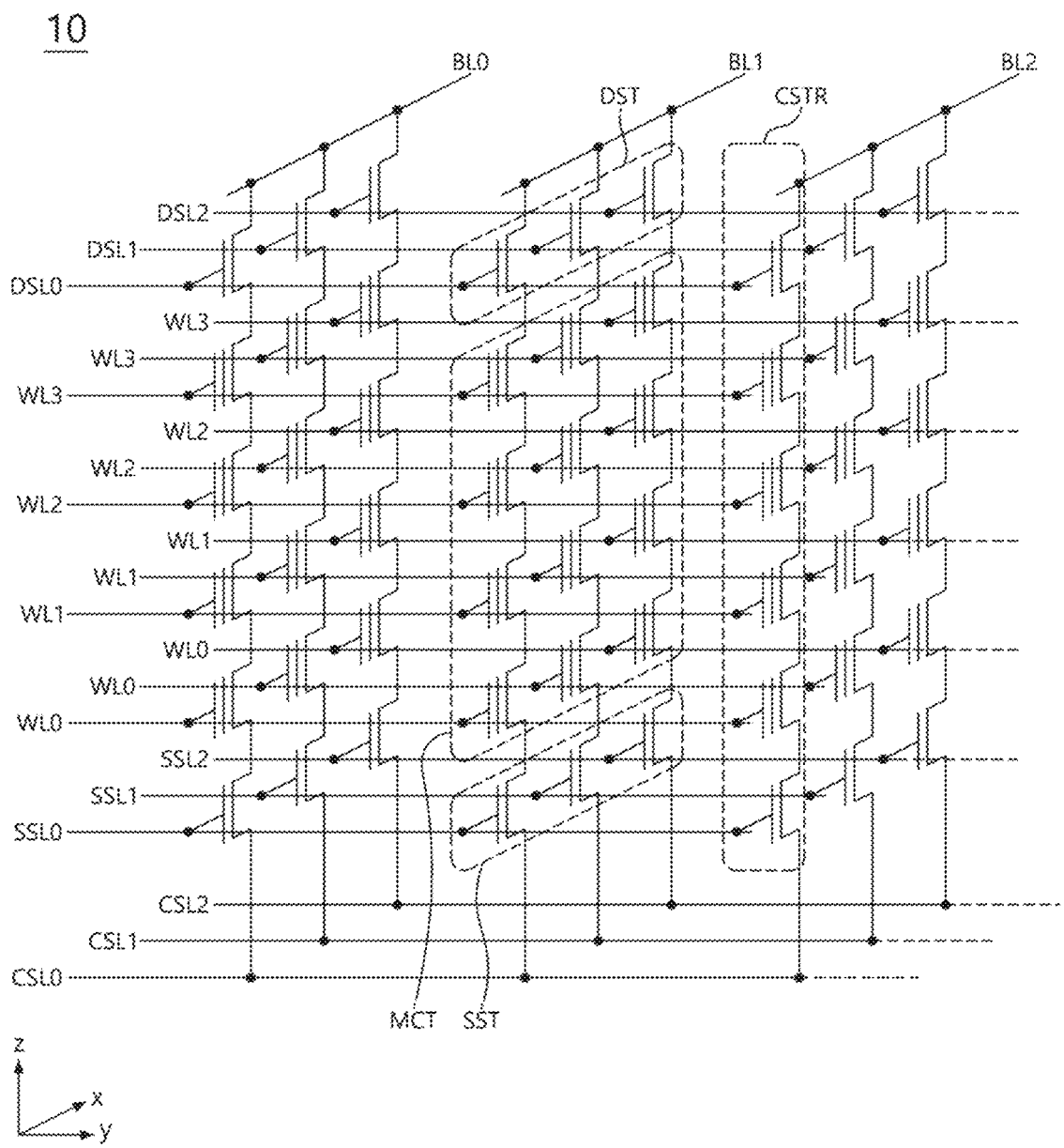
FIG. 1 is a circuit diagram illustrating a cell array of a 3D non-volatile memory device in accordance with an embodiment of the present invention.

Referring to FIG. 1, a circuit diagram is provided which illustrates a cell array of a 3D non-volatile memory device in accordance with an embodiment of the present invention. The cell array is generally designated with numeral 10.

According to the embodiment of FIG. 1, the cell array 10 may include a plurality of common source lines CSL0 to CSL2, word lines WL0 to WL3, source select lines SSL0 to SSL2, drain select lines DSL0 to DSL2 and bit lines BL0 to BL2. The common source lines CSL0 to CSL2 may be parallel to each other. The bit lines BL0 to BL2 may be parallel to each other and extend in a first direction x. The common source lines CSL0 to CSL2, the word lines WL0 to WL3, the source select lines SSL0 to SSL2, and the drain select lines DSL0 to DSL2 may extend in a second direction y. The first and second directions may be perpendicular or substantially perpendicular to each other. However, the invention is not limited in the way and the first and second directions may be crossing at a different angle. The common source lines CSL0 to CSL2 and the bit lines BL0 to BL2 may extend in directions which intersect each other.

The cell array 10 of the 3D non-volatile memory device may include a plurality of cell strings CSTR. The cell strings CSTR may be connected to each of the cross sections between the common source lines CSL0 to CSL2 and the bit lines BL0 to BL2. Each cell string may extend in a third direction z. The third direction z may be perpendicular or substantially perpendicular to the plane of the first and second directions x and y. However, the disclosure may not be limited in this way and in other embodiments the third direction may be crossing with the plane of the first and second directions at a different angle.

The cell strings CSTR connected to one of the bit lines BL0 to BL2 may be connected to the plurality of common source lines CSL0 to CSL2. The cell strings CSTR connected to one of the common source lines CSL0 to CSL2 may be connected to the plurality of bit lines BL0 to BL2. The common source lines CSL0 to CSL2 may receive a same voltage or different voltages.

Each of the cell strings CSTR may include a source selection transistor SST connected with one of the common source lines CSL0 to CSL2, a drain selection transistor DST connected with one of the bit lines BL0 to BL2, and a plurality of memory cell transistors MCT connected in series between the source selection transistor SST and the drain selection transistor DST.

The source selection transistor SST, the memory cell transistors MCT and the drain selection transistor DST connected to one of the common source lines CSL0 to CSL2 and one of the bit lines BL0 to BL2 may be serially connected with each other.

The source selection transistor SST may include a source connected with a corresponding one of the common source lines CSL0 to CSL2, a gate connected with a source selection line SSL, and a drain connected with a memory cell transistor MCT. Each of the memory cell transistors MCT may be selected by a corresponding one of the word lines WL0 to WL3. In the illustrated embodiment, as an example, the word lines WL0 to WL3 are shown to extend in the second direction y which is perpendicular or substantially perpendicular to the first direction x which is the extending direction of the bit lines BL0 to BL2. However, the disclosure may not be limited in this way. The drain selection transistor DST may include a source connected with a memory cell transistor MCT, a gate connected with a corresponding one of the drain selection lines DSL0 to DSL2, and a drain connected to a corresponding one of the bit lines BL0 to BL2. Each of the memory cell transistors MCT may include a data storage element.

Figure 2:
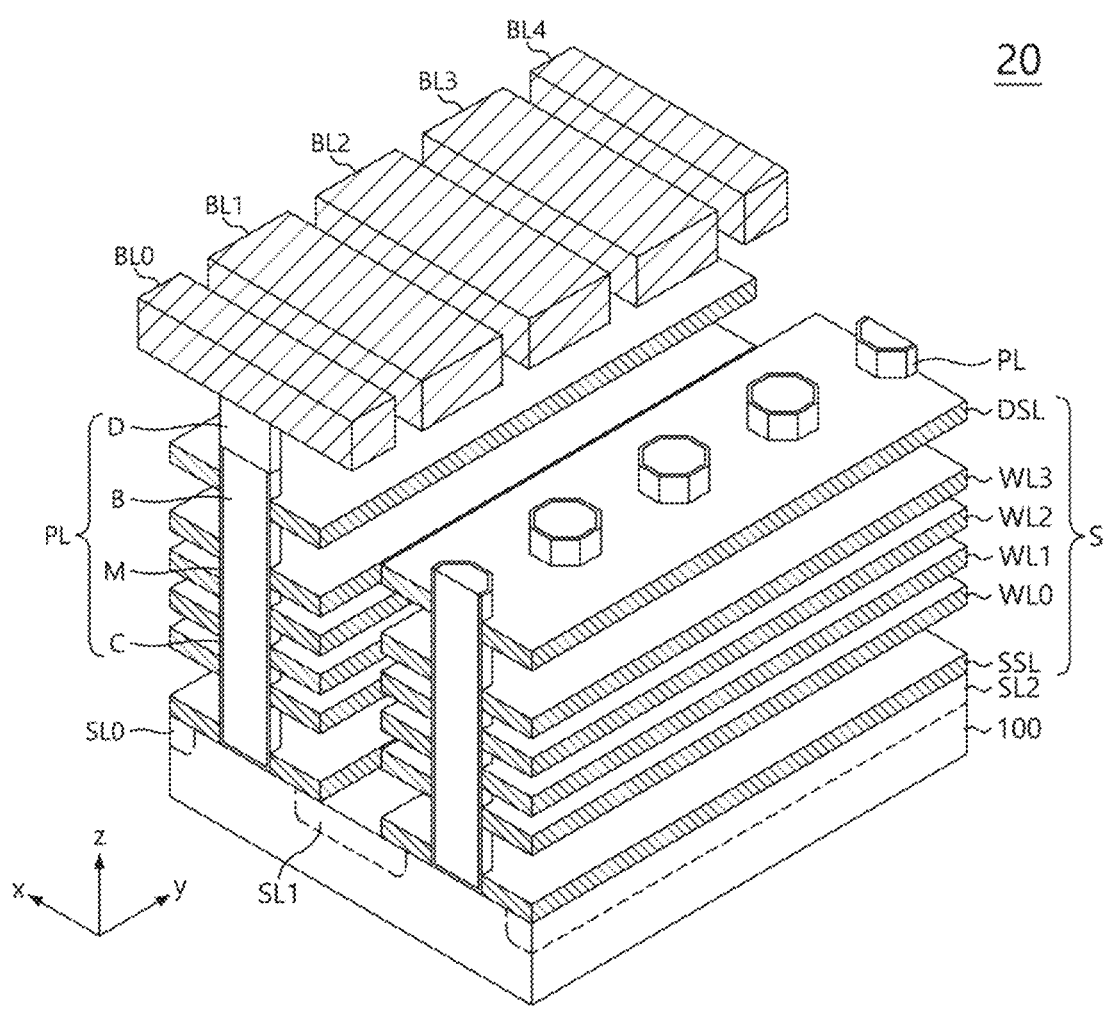
FIG. 2 is a perspective view illustrating a cell array of a 3D non-volatile memory device in accordance with an embodiment of the present invention.

FIG. 2 is a perspective view illustrating a cell array of a 3D non-volatile memory device in accordance with an embodiment of the present invention. Referring to FIG. 2, source lines SL0 to SL2 may include a conductive layer or a junction region formed in a semiconductor substrate 100. Bit lines BL0 to BL4 may be formed at a position vertically spaced apart from the semiconductor substrate 100. The bit lines BL0 to BL4 may include a conductive pattern. The cell strings CSTR may be connected between the source lines SL0 to SL2 and the bit lines BL0 to BL4 and may have the form of channel pillars PL.

Each of the channel pillars PL may be surrounded by a stack S. The stack S may include a source selection line SSL, word lines WL0 to WL3 and a drain selection line DSL. Insulation layers may be interposed between the source selection line SSL and an adjacent word line WL0, between the word lines WL0 to WL3, and between the drain selection line DSL and an adjacent word line WL3. In the embodiment of FIG. 2, each stack S includes one source selection line SSL and one drain selection line DSL, however the disclosure may not be limited in this way. The insulation layers are not shown to avoid crowding FIG. 2. However, it should be understood by those with ordinary skill in the art that the insulations layers are disposed in the gaps between the various conductive layers. The stacks S are arranged between corresponding ones of the source lines SL0 to SL2 and the bit lines BL0 to BL4.

Each of the stacks S may include a plurality of channel pillars PL extended from a surface of the semiconductor substrate 100 to corresponding bit lines BL0 to BL4, Each of the channel pillars PL may extend in the third direction and pass through the source selection line SSL, the word lines WL0 to WL3 and the drain selection line DSL. Each channel pillar PL may include a memory layer M, a channel layer C, a gap-filing insulation layer B and a capping layer D. The channel pillar PL may be formed by first forming a hole penetrating the stack, and then forming the channel layer C and the memory layer M on a side wall of the hole and a bottom surface of the hole. The gap-filling insulation layer B may be formed to fill the remaining gap inside the hole. The capping layer D may be formed on top of the gap-filling insulation layer B to fill a portion of the hole between the top of the gap-filling insulation layer B and a corresponding bit line. The top of the gap-filling insulation layer B may be above the top of the drain select line. The capping layer D may function as a junction region of the drain selection transistor DST in FIG. 1. The memory layer M may include a charge storage layer. For example, the memory layer M may include an insulating layer having a trap insulation layer, a floating gate electrode or conductive nano dots. Data in the memory layer M may be changed by a Fowler-Nordheim tunneling caused by a voltage difference between the channel pillar PL and the word lines WL0 to WL3. Alternatively, the memory layer M may store information using other operational principles. For example, the memory layer M may include a phase changeable layer or a variable resistive layer. Although not depicted in the drawings, a gate insulation layer may be formed on the memory layer M.

When a voltage is applied to the source selection line SSL, the word lines WL0 to WL3 and the drain selection line DSL, a charge transmission path, i.e., a channel may be formed in the memory layer M of the channel pillar PL so that the memory layer M may be driven as a MOSFET or a MOS capacitor.

Further, although not depicted in the drawings, a peripheral circuit for selecting the cell strings CSTR may be arranged between the semiconductor substrate 100 and the cell strings CSTR.

FIGS. 3A to 3G are perspective views illustrating a method of manufacturing a 3D non-volatile memory device in accordance with an embodiment of the present invention. FIGS. 4A to 4G are cross-sectional views corresponding to the perspective views of FIGS. 3A to 3G for illustrating the method of manufacturing.

Figure 3A:
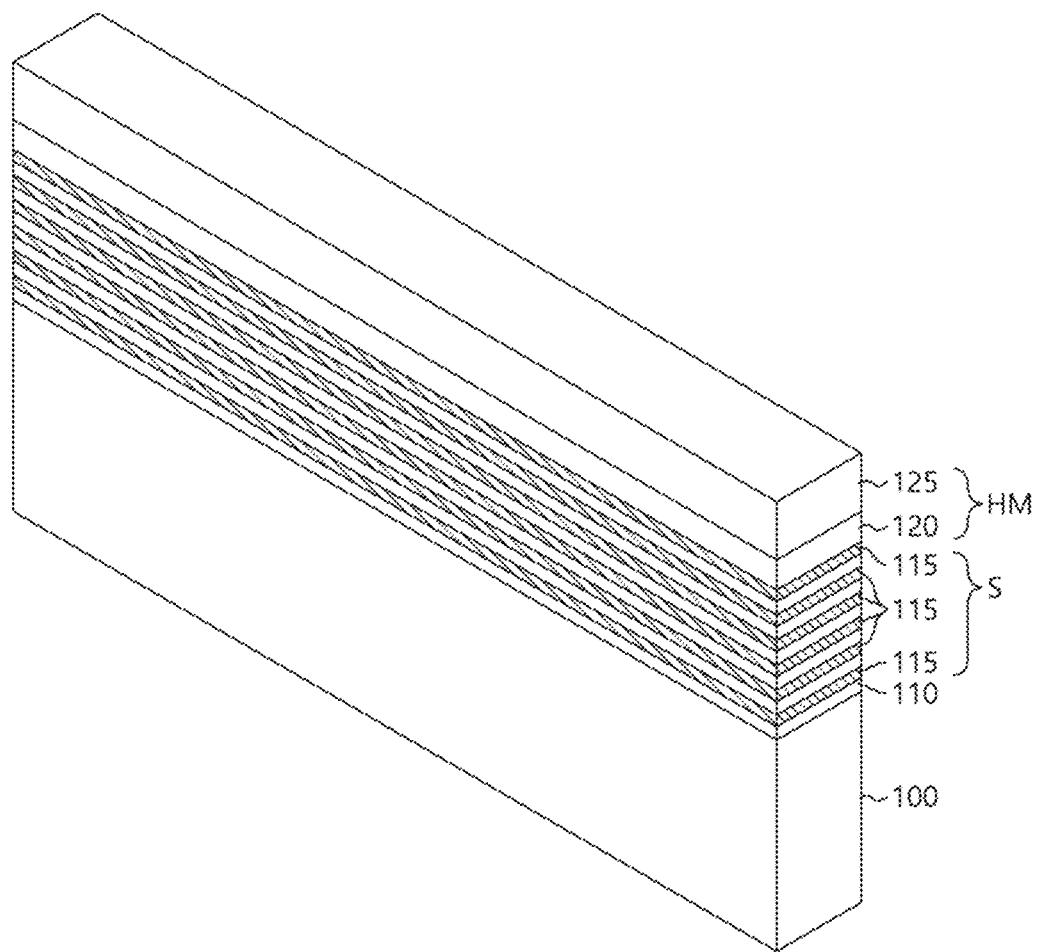
FIGS. 3A to 3G are perspective views illustrating a rr ethod of manufacturing a 3D non-volatile memory device in accordance with an embodiment of the present invention.
Figure 4A:
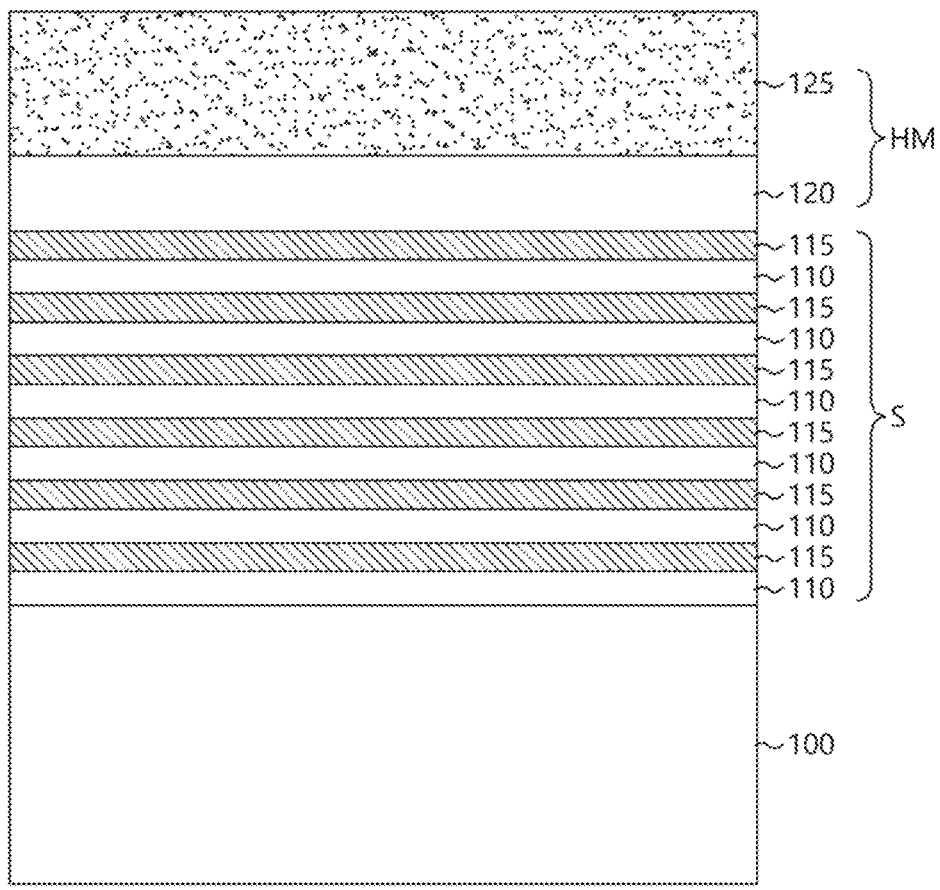

Referring to FIGS. 3A and 4A, at least one first layer 110 and at least one second layer 115 may be alternately formed on the semiconductor substrate 100 to form a stack structure S. The second layers 115 may include a material having an etching selectivity different from a material of the first layers 110. For example, in an embodiment, the first layers 110 may include a silicon oxide layer and the second layers 115 may include a silicon nitride layer. The second layers 115 may function as sacrificial layers for defining corresponding gate regions. The number of the second layers 115 in the stack structure S may correspond to the number of transistors formed in a cell string included in the stack. The first layers 110 of the stack structure S may each have a first thickness. The second layers 115 of the stack structure S may each have a second thickness. The first and the second thicknesses may be equal or different. In the illustrated embodiment, as an example, the first thickness may be greater than the second thickness.

A hard mask layer HM may be formed on the stack structure S. The hard mask layer HM may include first and second layers 120 and 125. The first layer 120 may be made of a first suitable insulator material and may be, for example, a silicon oxide layer. The second layer 125 may be made of a second suitable insulator material and may be, for example, a silicon nitride layer. Peripheral circuits (not shown) such as a row decoder circuit and a column decoder circuit may be arranged between the semiconductor substrate 100 and the stack structure S.

Figure 3B:
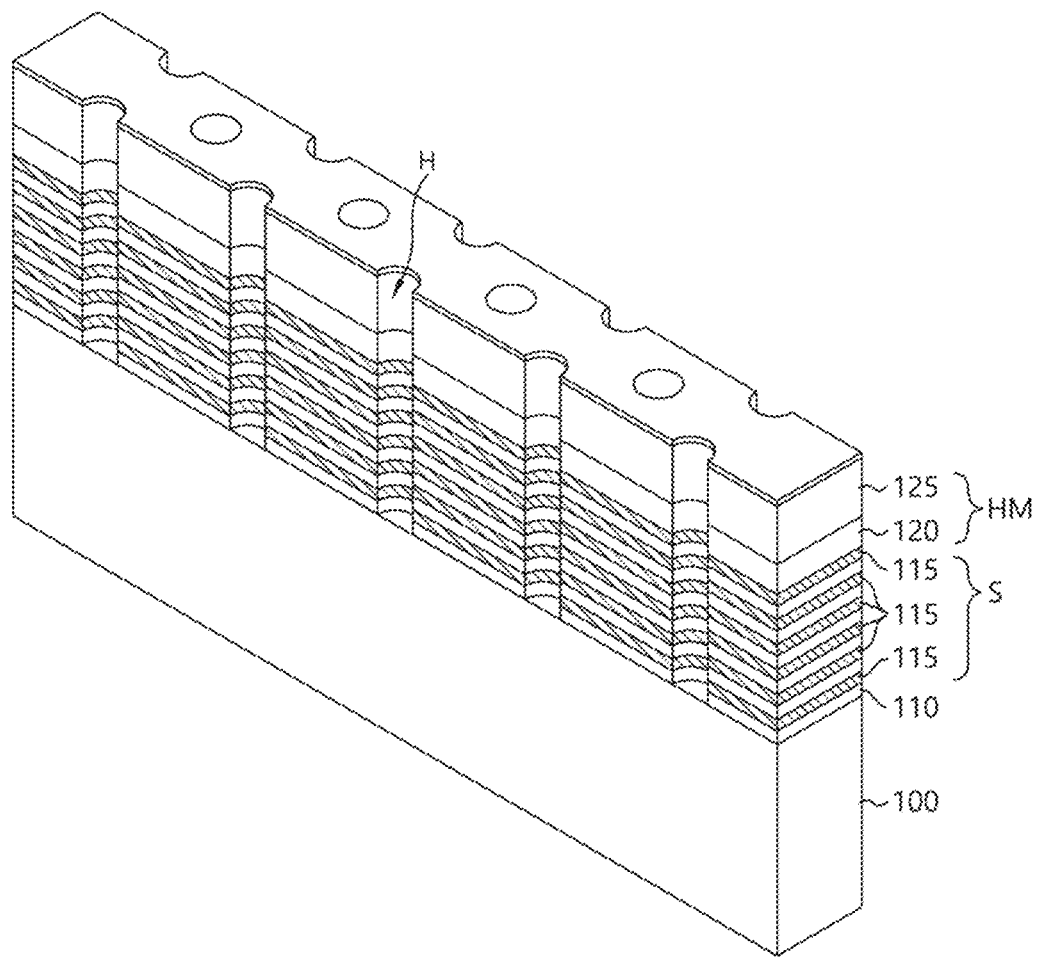
Figure 4B:
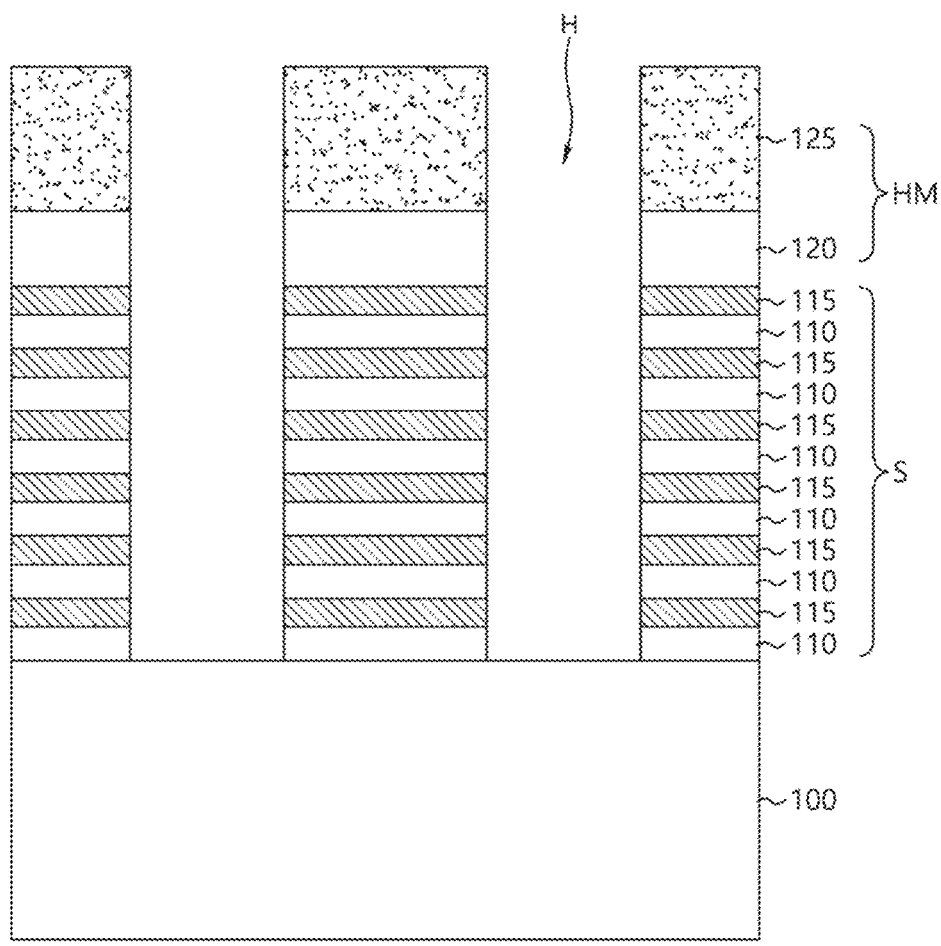

Referring to FIGS. 3B and 4B, a photoresist pattern (PRP) may be formed on the hard mask layer HM. The hard mask layer HM may be patterned using the photoresist pattern as a pattern mask to form a hard mask pattern. The stack structure S may be etched using the hard mask pattern as an etch mask to form contact holes H. The contact holes H may extend in the third direction z through the stack structure S. The contact holes H may be arranged in spaced intervals in any suitable pattern along the x and y directions. For example, the holes H may be arranged in a zig-zag pattern along the first and second directions x and y.

Figure 3C:
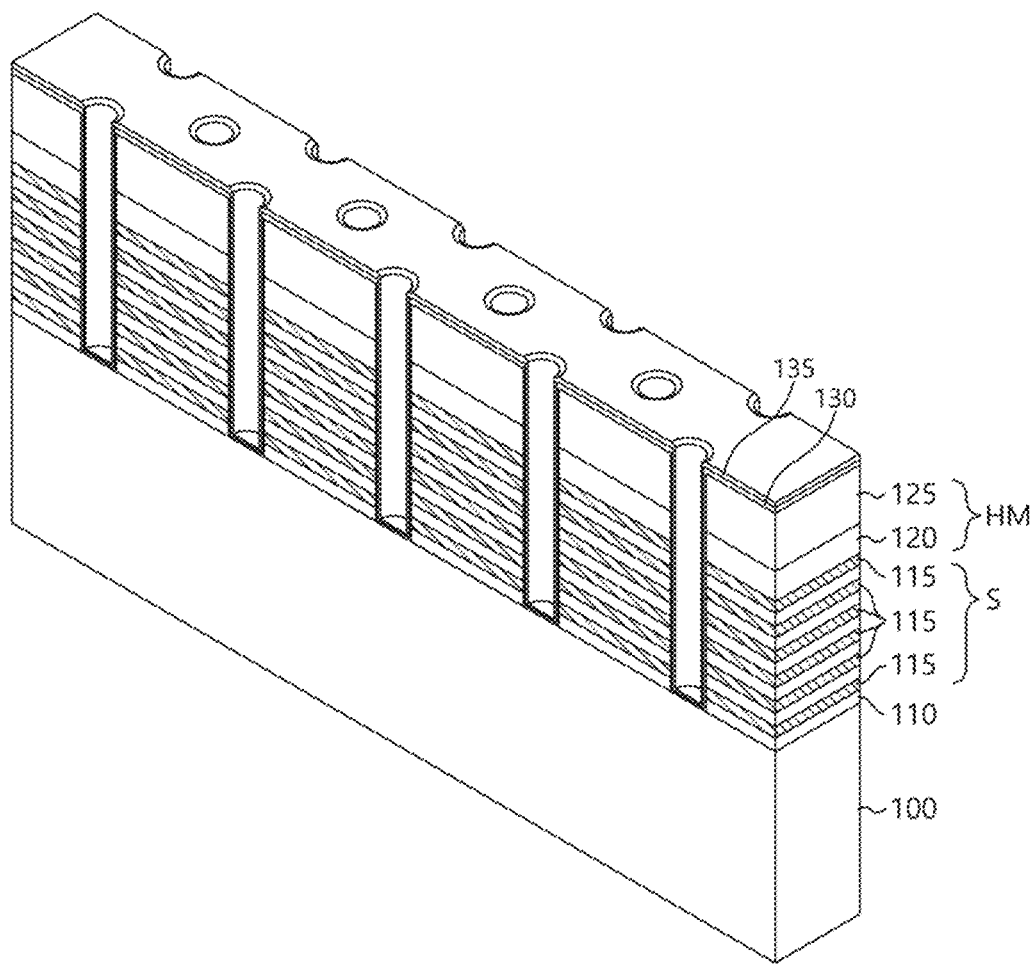
Figure 4C:
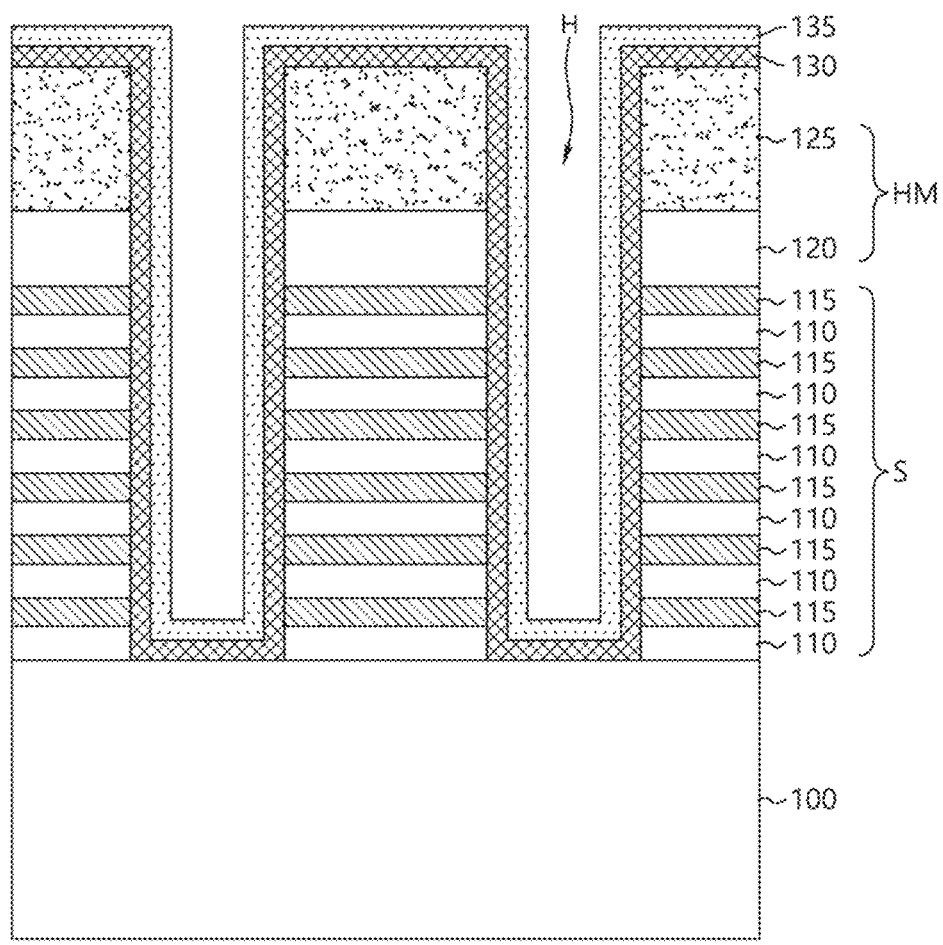

Referring to FIGS. 3C and 4C, a memory layer 130 and a channel layer 135 may be formed conformally to cover an upper surface of the hard mask layer HM and an inner surface of each contact hole H. The memory layer 130 and a channel layer 135 may be formed sequentially with the memory layer 130 formed first to cover an upper surface of the hard mask layer HM and an inner surface of each contact hole H and the channel layer 135 formed second to cover the memory layer 130. The memory layer 130 and the channel layer 135 may be formed using an atomic layer deposition process, however, the disclosure may not be limited in this way. The memory layer 130 may include at least one of a charge blocking layer, a data storage layer and a tunnel insulation layer which may be formed sequentially. The data storage layer may include a silicon layer, a silicon nitride layer, a phase changeable layer, a ferroelectric layer or nano dots, etc. The channel layer 135 may include a polysilicon layer. For example, the channel layer 135 (as deposited) may have an intrinsic state without conductivity.

Figure 3D:
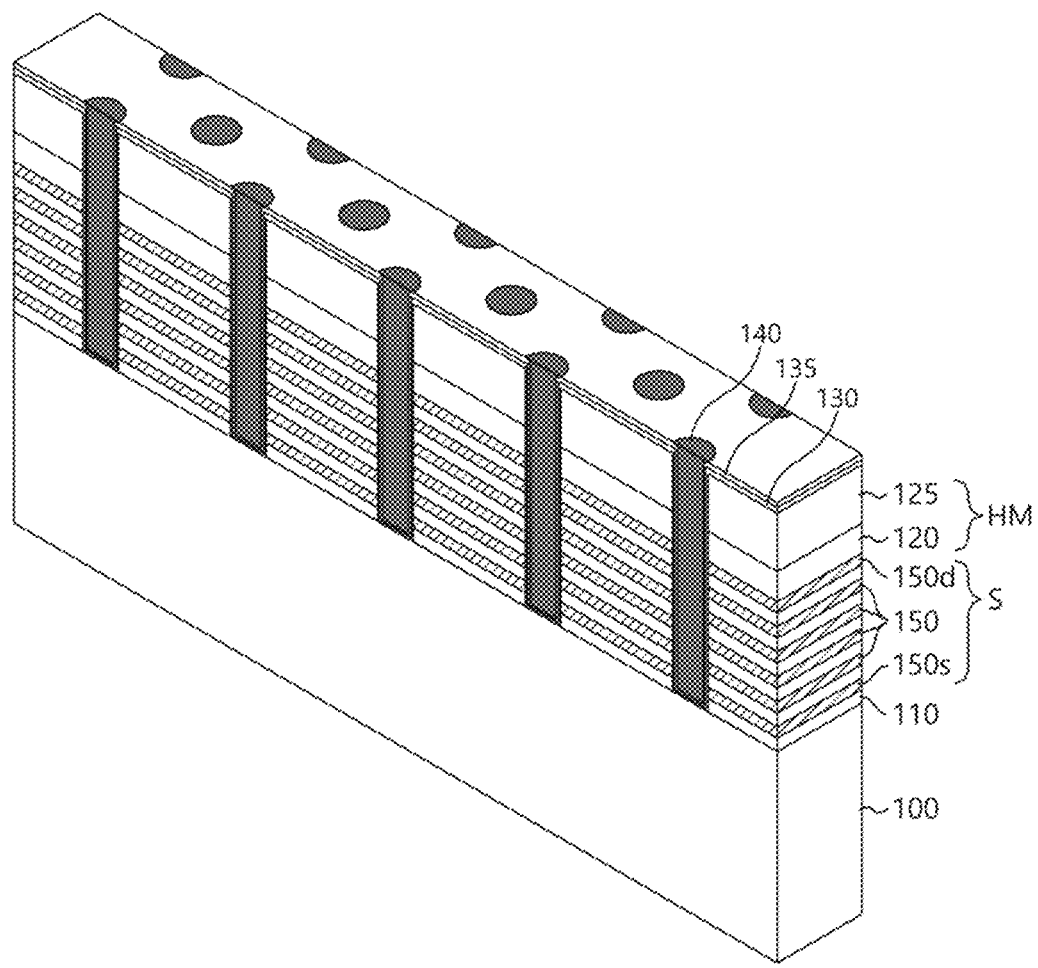

Referring to FIGS. 3D and 4D, a gap-filling insulation layer 140 may be formed on a surface of the channel layer 135 to fill the remaining gap (empty space) of each of the contact holes H. In an embodiment, the gap-filling insulation layer 140 may be formed by a spin deposition process. For example, the gap-filling insulation layer 140 may include any suitable flowable spin-on dielectric (SOD) material which has an adequately effective gap-filling characteristic to prevent forming of voids inside the contact holes H. The SOD material may include any of a plurality of suitable solvents. The SOD material and/or the channel layer 135 may be heated to improve the flowability of the flowable SOD material, however, the disclosure is not limited in this way. In an embodiment, the gap-filling insulation layer 140 may be formed using a PSZ-SOD (perhydropolysilazane-based inorganic spin-on dielectric) which has an adequately effective gap-filling characteristic. The gap-filling insulation layer 140 may be formed to have a sufficient thickness for burying the contact holes H. Following the deposition of the SOD material, a curing or baking step may follow to remove any remaining solvent and to solidify the insulation layer 140. The gap-filling insulation layer 140, the channel layer 135 and the memory layer 130 may then be planarized to expose a surface of the hard mask layer HM. For example, a CMP (chemical/mechanical planarization) process may be used.

The second layers 115 may then be selectively removed to define a plurality of corresponding gate regions. For example, the second layers 115 may be removed by a wet etching process.

Conductive layers may be formed in the gate regions formed by removing the second layers 115, to form a plurality of corresponding gates 150s, 150 and 150d. The gate 150s may correspond to a gate of a lower source selection transistor. The gates 150 may correspond to gates of memory cell transistors. The gate 150d may correspond to an uppermost gate of a drain selection transistor. In the illustrated embodiment of the present invention, the gate 150s of the source selection transistor and the gate 150d of the drain selection transistor are each a single gate, however, the disclosure is not limited in this way. For example, in other embodiments (not shown) each of the gates 150s and 150d may indicate a plurality of gates, e.g., two or three gates. For example, the uppermost gate 150d may be the drain selection transistor gate and may include a plurality of gates.

Figure 3E:
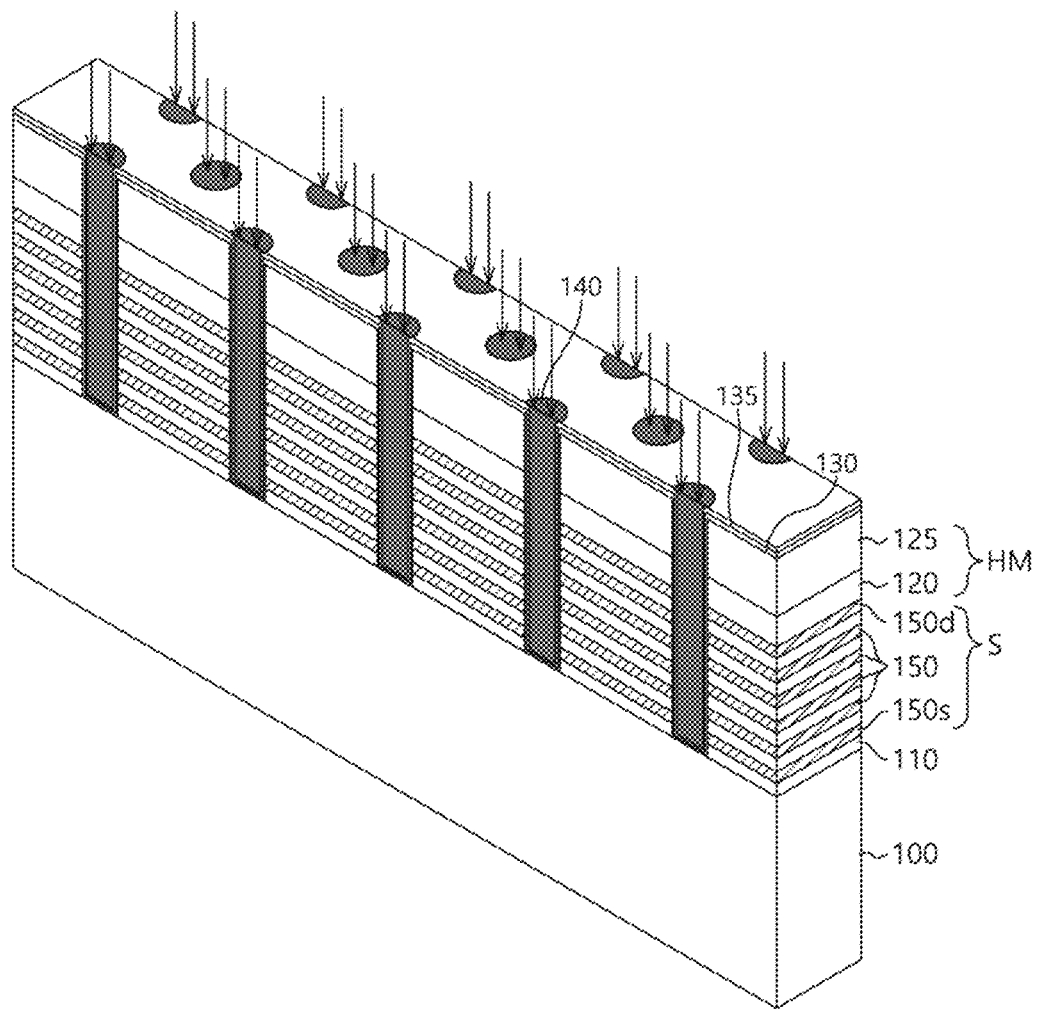
Figure 4E:
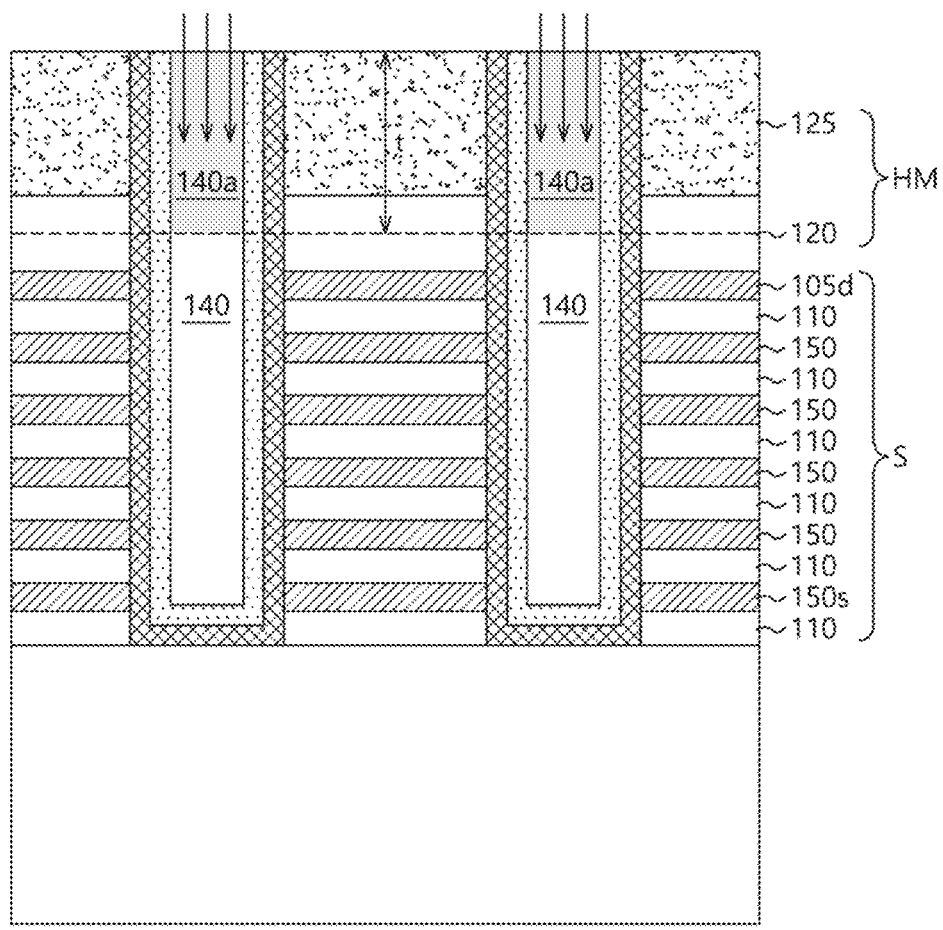

As shown in FIGS. 3E and 4E, the gap-filling insulation layer 140 may be partially removed to define a preliminary junction region of the drain selection transistor, for example, a drain of the drain selection transistor.

According to an embodiment of the present invention, defining the preliminary junction region of the drain selection transistor, includes accurately etching the gap-filling insulation layer 140. This is because, it has been realized that when the gap-filling insulating layer 140 is not accurately etched, for example, when the gap-filling insulating layer 140 is etched less than a target thickness, the drain of the drain selection transistor may not overlap with the edge of the gate 150d in the drain selection transistor so that a channel of the drain selection transistor may not be generated. Or, when the gap-filling insulation layer 140 is etched more than a target thickness, the gate of the drain selection transistor may have a width that is too narrow and may cause punch through.

Various embodiments of the present invention address these issues by accurately etching the gap-filling insulation layer 140. Specifically, an etched depth of the gap-filling insulation layer 140 is set to position an interface of the junction region in the drain selection transistor at an upper edge of the uppermost gate.

More specifically, for accurately controlling the etched depth of the gap-filling insulation layer 140, before performing the etching of the gap-filling insulation layer 140, an ion implantation process is performed to generate artificial damages to an etch target position "t" of the gap-filling insulation layer 140. The ion implantation process may implant the ions inside the gap-filling insulation layer 140 up to a desired depth to ensure the proper alignment of the junction interface.

Because the gap-filling insulation layer 140 which is doped with ions has a different etching selectivity from that of the gap-filling insulation layer 140 which is undoped with the ions, the gap-filling insulation layer 140 doped with the ions may be selectively removed. The etch target position t may be determined in accordance with a diffusion distance of the junction region formed later. The implantation process may be controlled to ensure that ions do not diffuse deeper than the set etch target position t.

The ions may include an inert ion. For example, the inert ion may be an argon ion. However, any ions that are suitable for adequately changing the etching characteristics of the gap-filling insulation layer 140 may be used.

Figure 3F:
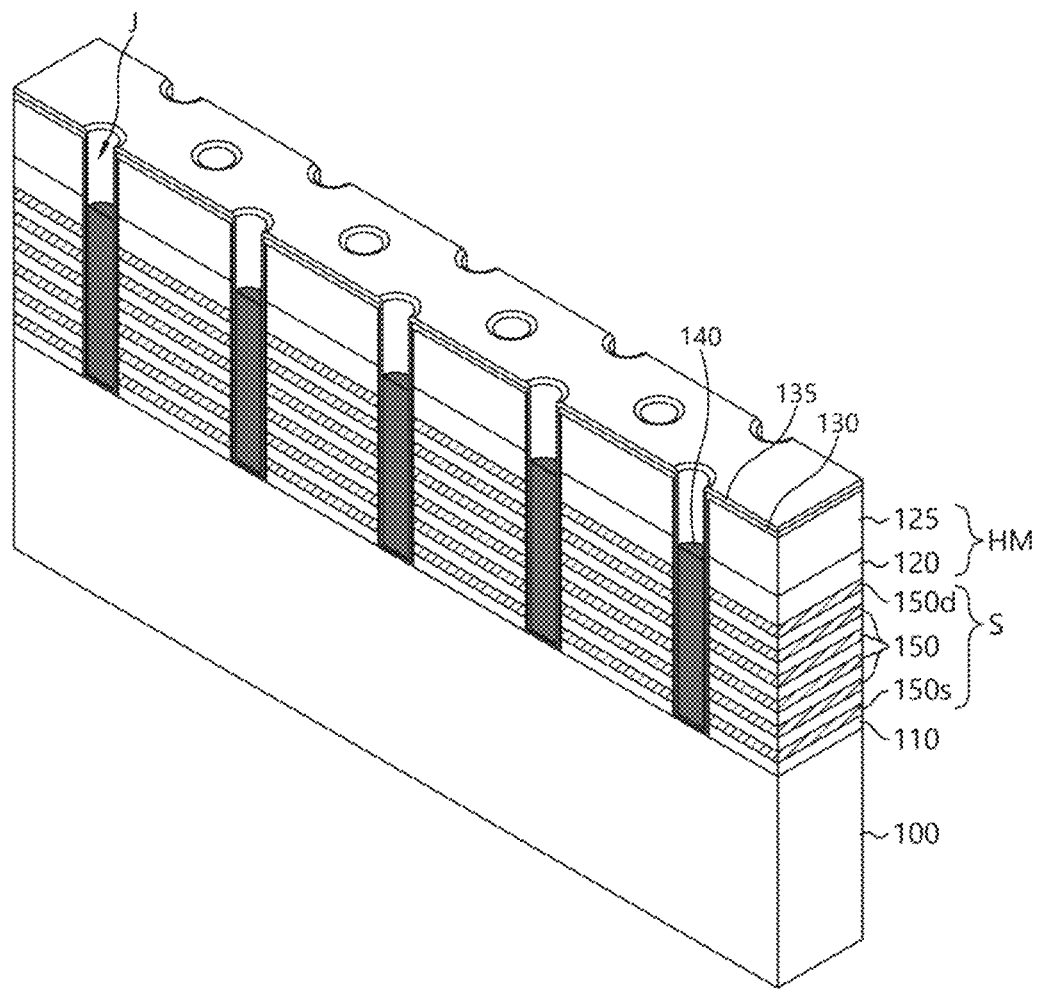

Referring to FIGS. 3F and 4F, the gap-filling insulation layer 140a which is doped with the ions may be selectively removed to form the preliminary junction region J on the gap-filling insulation layer 140 in the contact holes H.

Figure 3G:
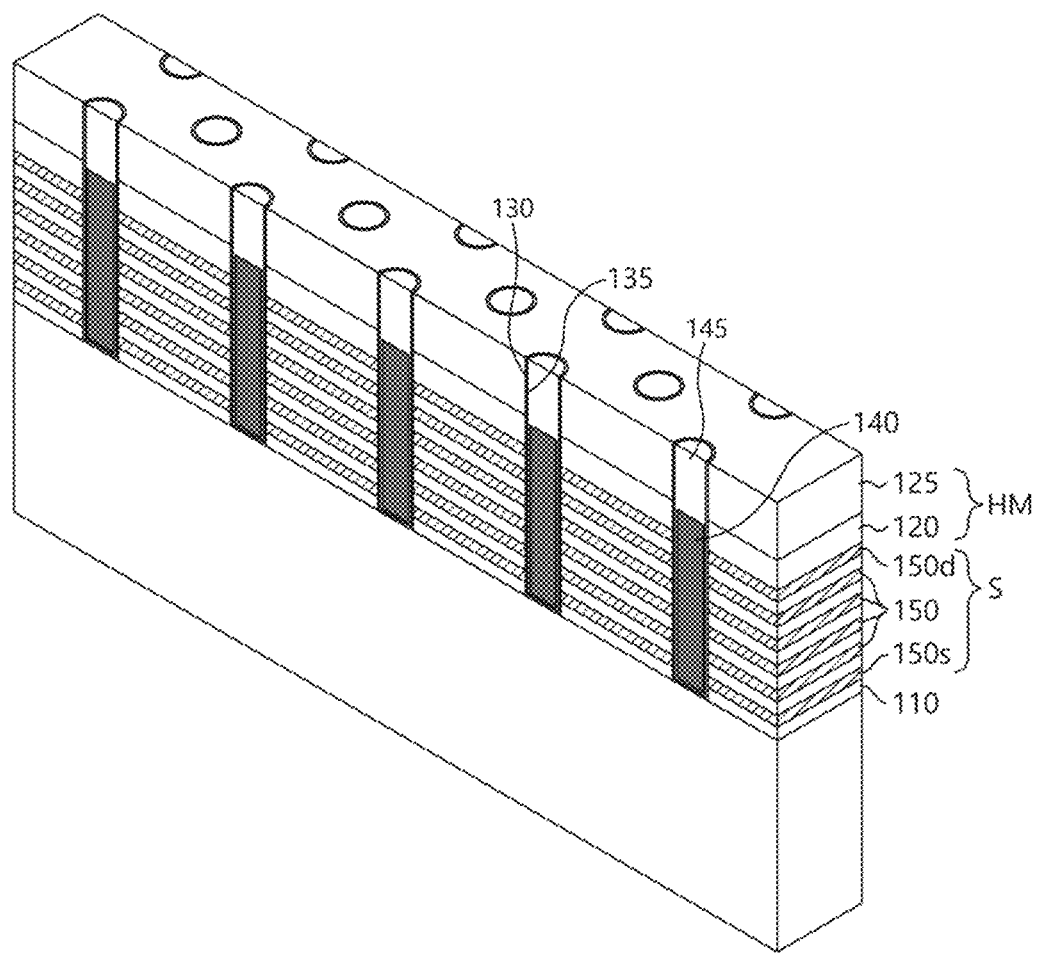
Figure 4G:
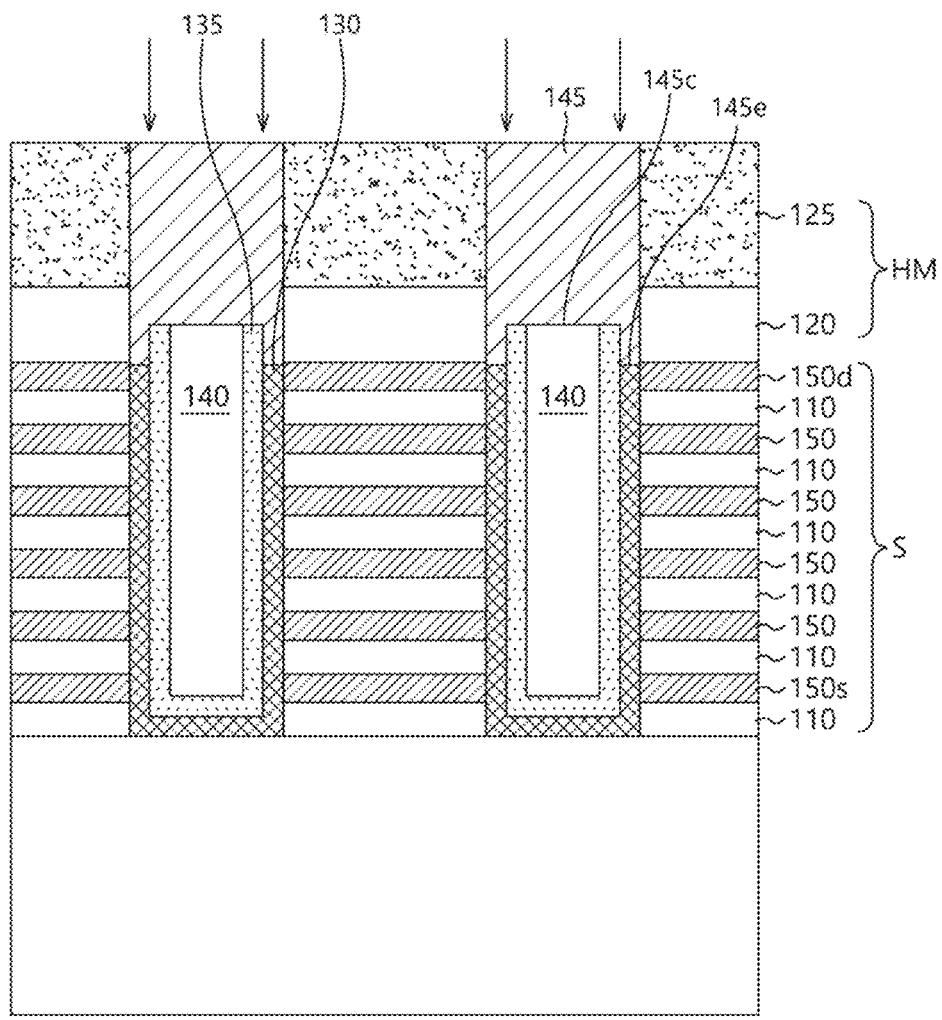

Referring to FIGS. 3G and 4G, a polysilicon layer may be formed on the gap-filling insulation layer 140 to fill up the preliminary junction region J. For example, when the drain selection transistor may include an NMOS transistor, the polysilicon layer may include a polysilicon layer doped with N type dopants. The polysilicon layer may be planarized until the hard mask layer HM may be exposed to form a capping layer 145 corresponding to the junction region of the drain selection transistor. P type dopants such as boron ions may be implanted into the channel layer 135 by controlling a target implanting depth to provide the channel layer 135 with conductivity.

A thermal process may be performed so that the N type dopants in the capping layer 145 may diffuse into an upper portion of the channel layer 135 and an upper portion of the memory layer 130 to define the junction region, i.e., the drain of the drain selection transistor. For example, the N type dopants may be diffused more into the memory layer 130 than the channel layer 135. Thus, a height of a remaining memory layer 130 may be lower than the heights of the gap-filling insulation layer 140 and a remaining channel layer 135. In other word, the capping layer 145 corresponding to the junction region of the drain selection transistor is formed to have a thicker edge portion 145e than the center portion 145c due to a diffusion of the N type dopants. Further, the P type dopants in the channel layer 135 may be activated by the thermal process.

According to the described embodiment of the present invention, the gap-filling insulation layer 140 may be accurately etched by the ion implantation process to form the capping layer 145 having a uniform thickness and form the drain of the drain selection transistor. Thus, adverse variations of the characteristics of the drain selection transistor may be suppressed.

Figure 5:
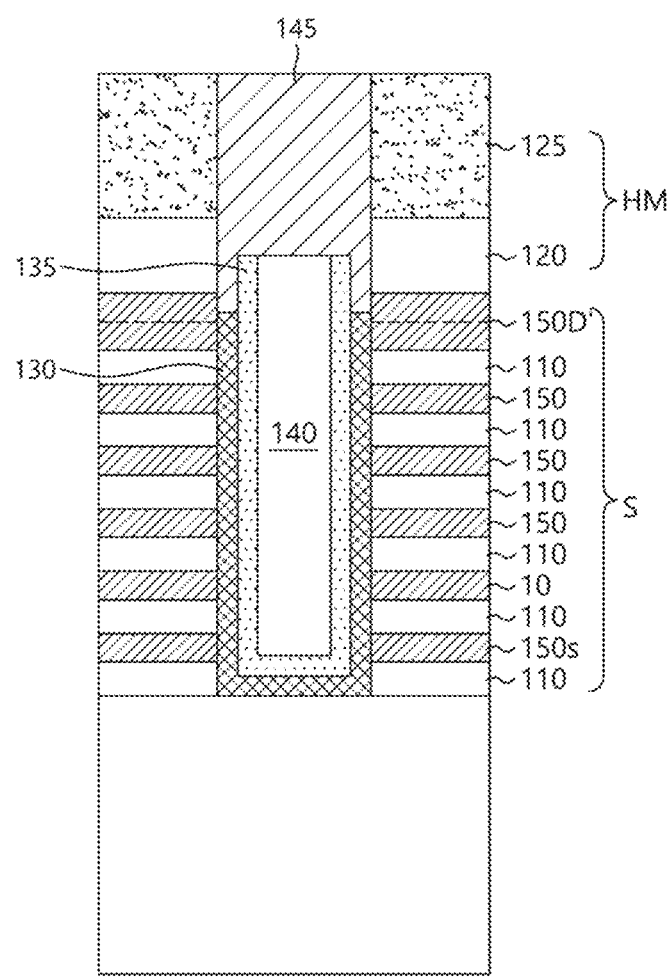
FIG. 5 is a cross-sectional view illustrating a method of manufacturing a 3D non-volatile memory device in accordance with an embodiment of the present invention.

FIG. 5 is a cross-sectional view illustrating a method of manufacturing a 3D non-volatile memory device in accordance with an embodiment of the present invention.

Referring to FIG. 5, a gate 150D' of the drain selection transistor may be formed to have a length (dimension in the third direction Z) greater than that of each of the gates of the other transistors of the cell string. Thus, an interface (hereinafter a junction interface JI) between the capping layer 145 and the memory layer 130 may be positioned within a length-range of the uppermost gate corresponding to the gate of the drain selection transistor. Although the precise positioning of the junction interface may be changed, adverse performance characteristic changes, of the drain selection transistor may be suppressed provided that the junction interface JI is positioned within a length-range of an uppermost gate corresponding to the gate of the drain selection transistor. By positioning the junction interface JI at an upper edge of the gate of the drain selection transistor the performance characteristics of the drain selection transistor may be improved substantially.

In an embodiment, the gate 150D' of the drain selection transistor may be formed to have a length greater than that of each of the gates 150 and 150s of the other transistors, by increasing the thickness of the uppermost second layer 115 in FIGS. 4A to 4C.

In another embodiment, in order to provide the uppermost gate 150D' of the drain selection transistor to have a greater length greater than that of each of the gates 150 and 150s of the other transistors, a conductive layer such as a doped polysilicon layer may be formed between the second layer 115d and the hard mask layer 120 to increase the length of the gate 150D' of the drain selection transistor.

According to an embodiment of the present invention, when the gate length of the drain selection transistor is increased, the region surrounding the edge of the gate may be expanded and a distance between the gate and the source may also be lengthened to reduce adverse characteristic changes of the drain selection transistor such as changes of threshold voltages, although the junction interface of the junction region diffused from the capping layer 145 may be changed.

Figure 6:
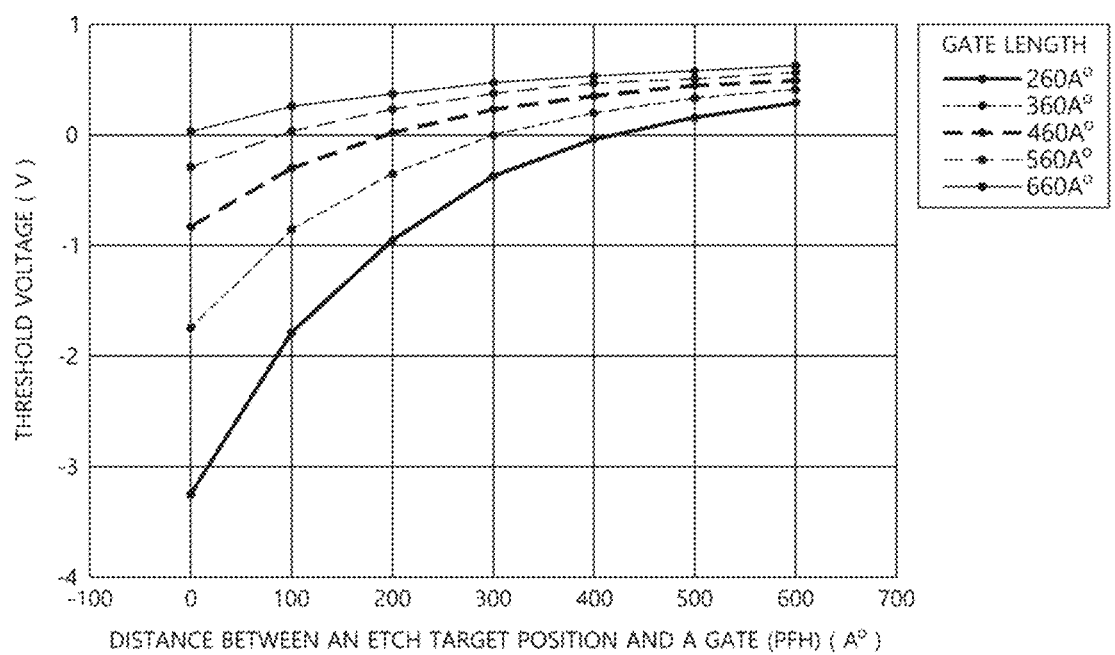
FIG. 6 is a graph showing threshold voltages of a drain selection transistor as a function of a distance between an etch target position and a gate in accordance with a gate length (thickness) in the drain selection transistor in accordance with an embodiment of the present invention.

FIG. 6 is a graph showing threshold voltages of a drain selection transistor as a function of a distance between an etch target position and a gate in accordance with a length (thickness) of the gate in the drain selection transistor in accordance with an embodiment of the present invention. The distance is measured in angstroms Å. The threshold voltage is measured in volts V.

Referring to FIG. 6, it is noted that changes of a threshold voltage Vth may be decreased in proportion to increasing of the gate length of the drain selection transistor, although the height of the polysilicon field oxide (PFH) between the etch target position of the gap-filling insulation layer and the gate edge may be changed.

FIG. 7 is a cross-sectional view illustrating a method of manufacturing a 3D non-volatile memory device in accordance with an embodiment of the present invention.

Referring to FIG. 7, as mentioned above, the length of the uppermost gate 150D' of the drain selection transistor may be increased. The ions may then be implanted into the gap-filling insulation layer 140 and the gap-filling insulation layer 140a which is doped with the ions may be selectively removed and the junction region formed. According to the described embodiments of the present invention, the position of the junction region of the drain selection transistor in the cell string may be accurately controlled to improve the characteristics of the drain selection transistor.

The above described embodiments of the present invention are intended to illustrate and not to limit the present invention. Various alternatives and equivalents are possible. The invention is not limited by the embodiments described herein. Nor is the invention limited to any specific type of semiconductor device. Other additions, subtractions, or modifications which will be obvious to those skilled in the art of the invention in view of the present disclosure are intended to fall within the scope of the appended claims.

What is claimed is:

1. A method of manufacturing a non-volatile memory device, the method comprising:
   forming a stack structure on a semiconductor substrate;
   etching the stack structure to form a contact hole through the stack structure;
   filling the contact hole with a gap-filling insulation layer;
   implanting ions into the gap-filling insulation layer to an etch target position;
   selectively removing the gap-filling insulation layer doped with the ions to define a preliminary junction region; and
   forming a junction region in the preliminary junction region.

2. The method of claim 1, wherein the ions comprise inert ions.

3. The method of claim 1, wherein forming the stack structure comprises alternately forming a first layer and a second layer on the semiconductor substrate.

4. The method of claim 3, after forming the gap-filling insulation layer, further comprising:
   removing the second layers; and
   forming a conductive layer in each space generated by the removing of the second layers to form a plurality of gates.

5. The method of claim 3, wherein forming the stack structure includes forming an uppermost second layer among the second layers to have a thickness greater than the thickness of any of the other second layers.

6. The method of claim 4, further comprising forming an additional conductive layer on an uppermost second layer to increase a thickness of an uppermost gate among gates.

7. The method of claim 4, wherein the etch target position of the gap-filling insulation layer is set to position a junction interface of the junction region at an upper edge of an uppermost gate among the gates.

8. The method of claim 1, wherein forming the junction region comprises:
   filling the preliminary junction region with a doped polysilicon layer; and
   planarizing the doped polysilicon layer.

9. The method of claim 1, wherein before forming the gap-filling insulation layer, further comprising:
   forming a memory layer on an inner surface of the contact hole; and
   forming a channel layer on the memory layer.

10. The method of claim 9, further comprising doping the channel layer with conductive dopants.

11. A method of manufacturing a non-volatile memory device, the method comprising:
    alternately forming first layers and second layers on a semiconductor substrate with a source line to form a stack structure;
    etching the stack structure to form a contact hole through the stack structure;
    sequentially forming a memory layer and a channel layer on an inner surface of the contact hole;
    filling the contact hole with a gap-filling insulation layer;
    removing the second layers;
    forming conductive layers in spaces generated by the removing of the second layers to form gates;
    implanting ions into the gap-filling insulation layer to an etch target position;
    removing the gap-filling insulation layer doped with the ions; and
    forming a junction region in a space generated by removing the gap-filling insulation layer,
    wherein an uppermost gate among the gates has a thickness greater than that of other gates.

12. The method of claim 11, wherein forming the second layers includes forming an uppermost second layer among the second layers to have a thickness greater than that of other second layers.

13. The method of claim 11, before forming the contact hole, further comprising: forming a conductive layer on an uppermost second layer.

14. The method of claim 11, wherein implanting the ions into the gap-filling insulation layer comprises implanting inert ions into the gap-filling insulation layer.

15. The method of claim 11, wherein the etch target position of the gap-filling insulation layer is set to position a junction interface of the junction region at an upper edge of an uppermost gate among the gates.

16. The method of claim 11, wherein forming the junction region comprises:
    forming a doped polysilicon layer in the space generated by removing the gap-filling insulation layer;
    doping the channel layer with conductive dopants; and
    activating the dopants in the doped polysilicon layer and the channel layer by performing a thermal process.

17. A method of manufacturing a non-volatile memory device, the method comprising:
    forming a stack of alternating insulating and gate layers;
    forming a hole penetrating the stack;

forming a memory layer and a channel layer sequentially on an internal surface of the hole to form a gap in the center of the hole;

filling the gap of the hole with a gap-filling insulation layer;

implanting ions into the gap-filling insulation layer to diffuse into the gap-filling insulation layer up to an etch target position;

removing the gap-filling insulation layer doped with the ions to define a preliminary junction region; and forming a junction region in the preliminary junction region, wherein the etch target position of the gap-filling insulation layer is set to position a junction interface of the junction region at an upper edge of an uppermost gate layer.

18. The method of claim 17, wherein the ions comprise inert ions.

19. The method of claim 17, wherein the uppermost gate layer has a thickness greater than the thickness of any of the other gate layers.

20. The method of claim 17, wherein the forming of the junction region comprises filling the preliminary junction region with a doped polysilicon layer, and planarizing the doped polysilicon layer.

21. The method of claim 17, wherein the filling of the hole with a gap-filling insulation layer is performed by spin deposition of a gap-filling insulation material which has an adequately effective gap-filling characteristic to prevent forming of voids inside the contact hole.

22. The method of claim 21, wherein the gap-filling insulation material is perhydropolysilazane-based inorganic spin-on dielectric material.

23. The method of claim 21, wherein an interface between the junction region and the memory layer is positioned within a length-range of the uppermost gate.

24. A method of manufacturing a memory device, the method comprising:

forming a gap in a stack of a plurality of layers;

filling the gap with a gap-filling insulation material to form a gap-filling insulation layer;

selectively removing an upper portion of the gap-filling insulation layer to create a free space inside the gap; and filling the free space of the gap with a polysilicon material to form a junction region having a junction interface with an uppermost layer of the stack positioned at an upper edge of the uppermost layer of the stack, wherein the selective removal of the upper portion of the gap-filling insulation layer comprises:

setting an etch target position within the gap-filling insulation layer;

implanting inert ions inside the gap filling insulation layer up to the etch target position; and etching the gap filling insulation layer which is doped with the implanting inert ions.

25. The method of claim 17, wherein the uppermost layer of the stack has a thickness greater than the thickness of any of the other layers of the stack.

* * * * *